(12) United States Patent
Miyazaki

(10) Patent No.: US 7,816,950 B2
(45) Date of Patent: Oct. 19, 2010

(54) SEMICONDUCTOR INTEGRATED CIRCUIT

(75) Inventor: Takayuki Miyazaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/540,032

(22) Filed: Aug. 12, 2009

(65) Prior Publication Data

US 2010/0039135 A1  Feb. 18, 2010

(30) Foreign Application Priority Data

Aug. 13, 2008 (JP) ............................ 2008-208395

(51) Int. Cl.
*H03K 19/00* (2006.01)
*H03K 19/007* (2006.01)

(52) U.S. Cl. ......................... 326/93; 326/14; 326/46; 327/202

(58) Field of Classification Search ............... 326/9, 326/14, 46, 93; 327/202
See application file for complete search history.

(56) References Cited

U.S. PATENT DOCUMENTS 6,788,105 B2 * 9/2004 Kono ........................... 326/46
7,167,024 B2 * 1/2007 Momtaz et al. ................ 326/46
7,409,631 B2 * 8/2008 Tschanz et al. ............. 714/798

OTHER PUBLICATIONS

Yoshihide Komatsu, et al., "A Soft-Error Hardened Latch Scheme for SoC in a 90nm Technology and Beyond", IEEE 2004 Custom Integrated Circuits Conference, 2004, pp. 329-332.
Yoichi Sasaki, et al., "Soft Error Masking Circuit and Latch Using Schmitt Trigger Circuit", Proceedings of the 21$^{st}$ IEEE International Symposium on Defect and Fault-Tolerance in VLSI Systems (DFT'06), 2006, 9 pages.
T. Calin, et al., "Upset Hardened Memory Design for Submicron CMOS Technology", IEEE Transactions on Nuclear Science, vol. 43, No. 6, Dec. 1996, 5 pages.
Ashish Góel, et al., "Low-Overhead Design of Soft-Error-Tolerant Scan Flip-Flops with Enhanced-Scan Capability", Digest of Technical Papers, Asia and South Pacific Conference on Design Automation, 2006, pp. 665-670.

* cited by examiner

*Primary Examiner*—James Cho
(74) *Attorney, Agent, or Firm*—Oblon, Spivak, McClelland, Maier & Neustadt, L.L.P.

(57) ABSTRACT

Semiconductor integrated circuit has a control circuit. The control circuit causes the clock signal generating circuit to control the first clock signal and the second clock signal to make a logic of data held by the first data holding terminal and a logic of data held by the second data holding terminal equal to each other, and switches on the switch circuit, and the error detection circuit senses a logic of the first data holding terminal and a logic of the second data holding terminal after switching on the switching circuit.

12 Claims, 7 Drawing Sheets

SEMICONDUCTOR INTEGRATED CIRCUIT

CROSS-REFERENCE TO RELATED APPLICATION

This application is based upon and claims the benefit of priority from the prior Japanese Patent Application No. 2008-208395, filed on Aug. 13, 2008, the entire contents of which are incorporated herein by reference.

BACKGROUND OF THE INVENTION

1. Field of the Invention

The present invention relates to a semiconductor integrated circuit that includes a master-slave flip-flop.

2. Background Art

In miniaturized semiconductor integrated circuits, soft errors due to alpha rays and neutron rays generated by cosmic rays and radioisotopic elements are serious problems in recent years.

When an alpha ray or a neutron ray is incident on a semiconductor integrated circuit, electric charges are generated at the portion on which the ray is incident, and the electric charges cause a false operation (a soft error) in the semiconductor integrated circuit.

Particularly, in a flip-flop, stored data might be inverted when the terminal that holds the data is irradiated.

According to a conventional technique developed to solve this problem, an error correction code (ECC) is used to detect and correct data that is inverted by a soft error in a memory circuit such as a Static Random Access Memory (SRAM) or a Dynamic Random Access Memory (DRAM).

However, it is difficult to implement such a technique in flip-flops.

To counter this problem, a technique for improving the soft-error resistance of flip-flops has been suggested. Still, the terminal capacity needs to be increased, or copies of data need to be retained, resulting in a delay or an area increase (fore example, to see A. Goel, S. Bhunia, H. Mahmoodi, and K. Roy, "Low-overhead design of soft-error-tolerant scan flip-flops with enhanced-scan capability," Digest of Technical Papers, Asia and South Pacific Conference on Design Automation pp. 665-670, 2006.).

In a memory circuit, flip-flops for storing configuration information and redundancy information are provided. The data stored in these flip-flops are constantly referred to while the memory circuit is operating. Furthermore, the data stored in those flip-flops are more important than data that are stored in memory cells which can be corrected at the time of reading.

When a soft error is caused in the data stored in a flip-flop, the timing information and redundancy information are destroyed. As a result, the memory circuit stops operating properly.

Therefore, in the above conventional case, a mechanism for detecting and correcting soft errors is required so as to maintain the reliability of the memory circuit.

SUMMARY OF THE INVENTION

According to one aspect of the present invention, there is provided: a semiconductor integrated circuit comprising:

a data input terminal;

a data output terminal;

a master latch circuit that has an input connected to the data input terminal, and has a first data holding terminal that holds a first logic of data that is input through the data input terminal or a second logic generated by inverting the first logic of the data;

a slave latch circuit that has an input connected to an output of the master latch circuit, has an output connected to the data output terminal, and has a second data holding terminal that holds a logic being equal to a logic held by the first data holding terminal in accordance with data that is input from the master latch circuit;

a clock signal generating circuit that generates and outputs a first clock signal for controlling an operation of the master latch circuit, and generates and outputs a second clock signal for controlling an operation of the slave latch circuit;

a switch circuit that is connected between the first data holding terminal and the second data holding terminal;

an error detection circuit that senses a logic of the first data holding terminal and a logic of the second data holding terminal, and outputs an error detection signal when a logic of the first data holding terminal and a logic of the second data holding terminal differ from each other; and a control circuit that controls the clock signal generating circuit and the switch circuit, wherein the control circuit causes the clock signal generating circuit to control the first clock signal and the second clock signal to make a logic of data held by the first data holding terminal and a logic of data held by the second data holding terminal equal to each other, and switches on the switch circuit, and the error detection circuit senses a logic of the first data holding terminal and a logic of the second data holding terminal after switching on the switching circuit.

According to another aspect of the present invention, there is provided: a semiconductor integrated circuit comprising:

a data input terminal;

a data output terminal;

a master latch circuit that has an input connected to the data input terminal, and has a first data holding terminal that holds a first logic of data that is input through the data input terminal or a second logic generated by inverting the first logic of the data;

a slave latch circuit that has an input connected to an output of the master latch circuit, has an output connected to the data output terminal, and has a second data holding terminal that holds a logic being equal to a logic held by the first data holding terminal in accordance with data that is input from the master latch circuit;

a clock signal generating circuit that generates and outputs a first clock signal for controlling an operation of the master latch circuit, and generates and outputs a second clock signal for controlling an operation of the slave latch circuit;

a switch circuit that is connected between the first data holding terminal and the second data holding terminal;

an error detection circuit that monitors current flowing in the switch circuit, and outputs an error detection signal when the current is equal to or greater than a predetermined value; and a control circuit that controls the clock signal generating circuit and the switch circuit, wherein the control circuit causes the clock signal generating circuit to control the first clock signal and the second clock signal to make a logic of data held by the first data holding terminal and a logic of data held by the second data holding terminal equal to each other, and switches on the switch circuit, and the error detection circuit monitors current flowing in the switch circuit when the switch circuit is in ON state after switching on the switching circuit.

According to still another aspect of the present invention, there is provided: a semiconductor integrated circuit comprising:

a data input terminal;

a data output terminal;

a master latch circuit that has an input connected to the data input terminal, and has a first data holding terminal that holds a first logic of data that is input through the data input terminal or a second logic generated by inverting the first logic of the data;

a slave latch circuit that has an input connected to an output of the master latch circuit, has an output connected to the data output terminal, and has a second data holding terminal that holds a logic being equal to a logic held by the first data holding terminal in accordance with data that is input from the master latch circuit;

a clock signal generating circuit that generates and outputs a first clock signal for controlling an operation of the master latch circuit, and generates and outputs a second clock signal for controlling an operation of the slave latch circuit;

a switch circuit that is connected between the first data holding terminal and the second data holding terminal;

an error detection circuit that monitor current supplied to the master latch circuit and the slave latch circuit, and outputs an error detection signal when the current is equal to or greater than a predetermined value; and a control circuit that controls the clock signal generating circuit and the switch circuit, wherein the control circuit causes the clock signal generating circuit to control the first clock signal and the second clock signal to make a logic of data held by the first data holding terminal and a logic of data held by the second data holding terminal equal to each other, and switches on the switch circuit, and the error detection circuit monitors current supplied to the master latch circuit and the slave latch circuit when the switch circuit is in ON state after switching on the switching circuit.

DETAILED DESCRIPTION

Comparative Example

First, the structure and functions of a general master-slave flip-flop as a comparative example are described.

Figure 1:
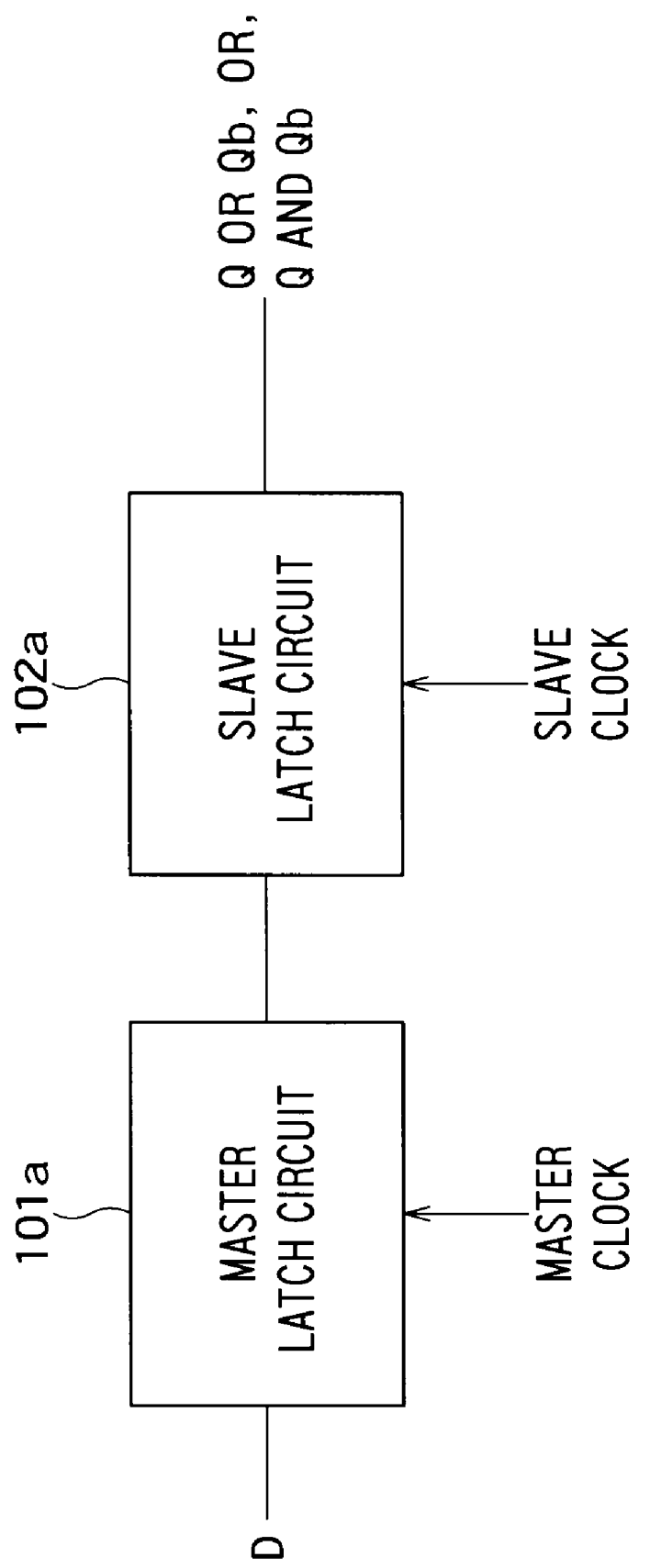
FIG. 1 is a block diagram showing a structure of a master-slave flip-flop 100a of a comparative example.

FIG. 1 is a block diagram showing the structure of the master-slave flip-flop 100a of the comparative example.

As shown in FIG. 1, the flip-flop 100a includes a master latch circuit 101a that receives input data D as an input, and a slave latch circuit 102a that receives an output of the master latch circuit 101a as an input and has its output as an output Q, Qb or the both of the flip-flop 100a.

A master clock is input to the master latch circuit 101a, and a slave clock is input to the slave latch circuit 102a.

The master latch circuit 101a and the slave latch circuit 102a each have a function to hold data, and a positive logic of the data and a negative logic of the data can be retained.

Here, the positive logic of the data held by the master latch circuit 101a is represented by msp, and the negative logic of the data held by the master latch circuit 101a is represented by msn. The positive logic of the data held by the slave latch circuit 102a is represented by ssp, and the negative logic of the data held by the slave latch circuit 102a is represented by ssn.

In the flip-flop 100a of the comparative example, either the master latch circuit 101a or the slave latch circuit 102a holds data in accordance with the input clock, and data is not held by both the master latch circuit 101a and the slave latch circuit 102a.

Therefore, as described above, when radiation is incident on a terminal that holds data, the held data is inverted, and a soft error is caused in the flip-flop.

To counter this problem, in a semiconductor integrated circuit according to an embodiment of the present invention, a master latch circuit and a slave latch circuit both hold data at the same time, and the data holding terminals of the master latch circuit and the slave latch circuit are electrically connected to each other via a switch circuit.

The switch circuit has a limited resistance value even in an ON state. As a result, a potential difference is caused between the data holding terminal of the master latch circuit and the data holding terminal of the slave latch circuit, while the switch circuit is in the ON state.

Accordingly, even where the data holding terminals of the master latch circuit and the slave latch circuit are electrically connected to each other, the data held by the master latch circuit (or the slave latch circuit) can be inverted by an alpha ray or a neutron ray, for example. As a result, the logic held by the data holding terminal of the master latch circuit might differ from the logic held by the data holding terminal of the slave latch circuit.

To counter this problem, an error detection circuit detects such a situation, and outputs an error detection signal. For example, the data stored in the flip-flop is replaced with correct data based on the error detection signal, so as to improve soft-error resistance.

The following is a description of embodiments of the present invention, with reference to the accompanying drawings.

First Embodiment

Figure 2:
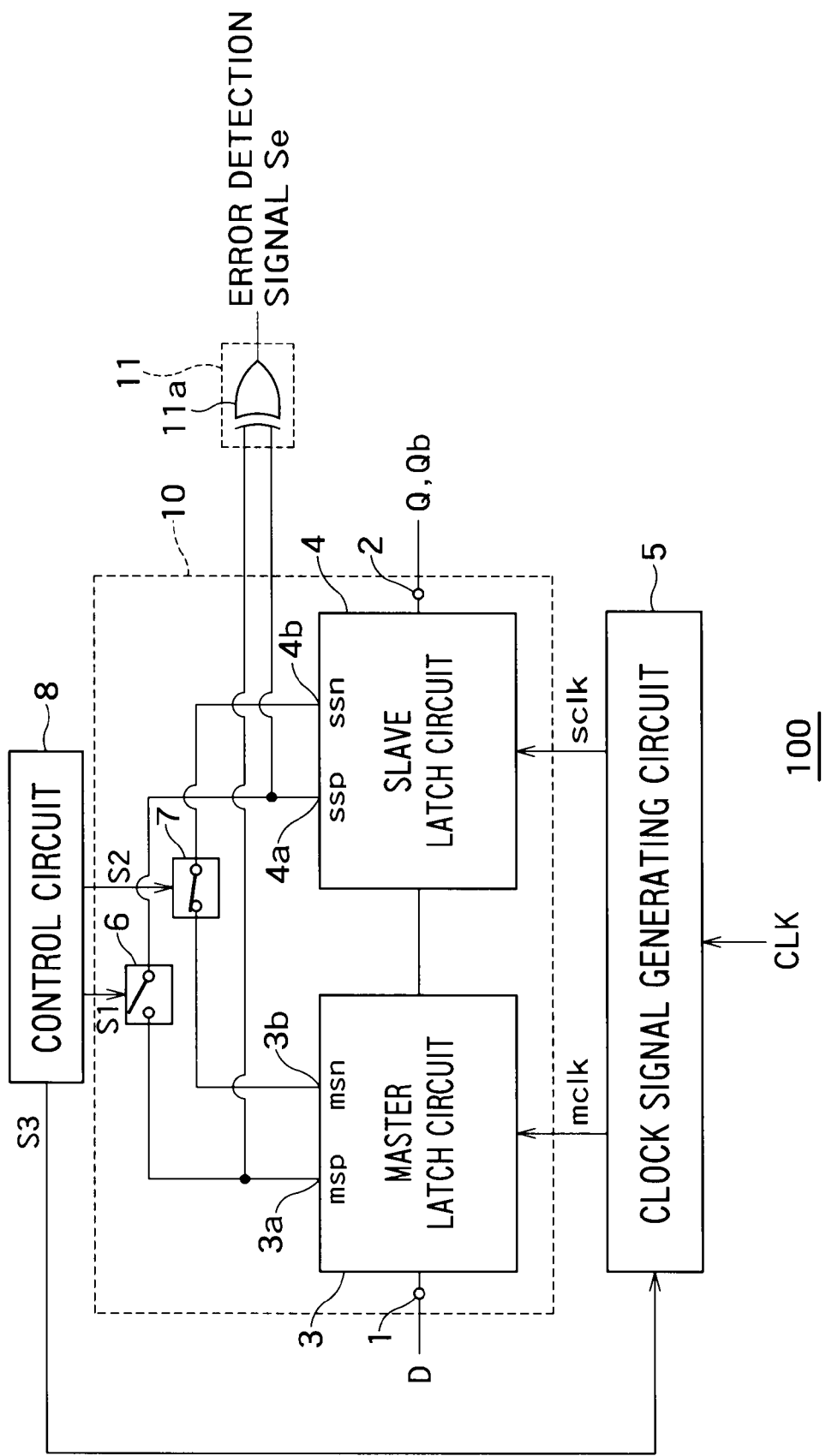
FIG. 2 is a diagram showing the structure of a main section of a semiconductor integrated circuit 100 in accordance with a first embodiment of a present invention.

FIG. 2 is a diagram showing the structure of the main section of a semiconductor integrated circuit 100 in accordance with a first embodiment of the present invention.

As shown in FIG. 2, the semiconductor integrated circuit 100 includes a data input terminal 1, a data output terminal 2, a master latch circuit 3, a slave latch circuit 4, a clock signal generating circuit 5, a first switch circuit 6, a second switch circuit 7, a control circuit 8, and an error detection circuit 11.

The data input terminal 1, the data output terminal 2, the master latch circuit 3, the slave latch circuit 4, the first switch circuit 6, and the second switch circuit 7 constitute a flip-flop 10.

The master latch circuit 3 has its input connected to the data input terminal 1. The master latch circuit 3 has a data holding terminal 3a that holds the positive logic msp of data that is input through the data input terminal 1.

The master latch circuit 3 also has a data holding terminal 3b that holds the negative logic (the logic obtained by inverting the logic held by the data holding terminal 3a) msn of the data that is input through the data input terminal 1.

The slave latch circuit 4 has its input connected to the output of the master latch circuit 3, and has its output connected to the data output terminal 2. The slave latch circuit 4 has a data holding terminal 4a that holds the positive logic ssp of data that is input from the master latch circuit 3. Accordingly, the data holding terminal 4a holds the same logic as the logic held by the data holding terminal 3a, because of the data input from the master latch circuit 3.

The slave latch circuit 4 also has a data holding terminal 4b that holds the negative logic (the logic obtained by inverting the logic held by the data holding terminal 4a) ssn of the data that is input from the master latch circuit 3. Accordingly, the data holding terminal 4b holds the same logic as the logic held by the data holding terminal 3b, because of the data input from the master latch circuit 3.

The clock signal generating circuit 5 generates and outputs a first clock signal mclk for controlling the operation of the master latch circuit 3, and a second clock signal sclk for controlling the operation of the slave latch circuit 4, based on a reference clock CLK.

In response to the first clock signal mclk, the master latch circuit 3 holds the data that is input from the data input terminal 1, or outputs the input data as it is (or outputs the input data after buffering the data). In response to the second clock signal sclk, the slave latch circuit 4 holds the data that is input from the master latch circuit 3, or outputs the input data as it is (or outputs the input data after buffering the data).

The first switch circuit 6 is connected between the data holding terminal 3a and the data holding terminal 4a.

The second switch circuit 7 is connected between the data holding terminal 3b and the data holding terminal 4b.

MOS transistors or transfer gates or the likes that are formed with MOS transistors may be used as the first and second switch circuits 6 and 7, for example.

The control circuit 8 controls the first switch circuit 6, the second switch circuit 7, and the clock signal generating circuit 5 with control signals S1, S2, and S3.

The error detection circuit 11 is formed with an exclusive-OR circuit 11a that has the logic (the potential) of the data holding terminal 3a and the logic (the potential) of the data holding terminal 4a input thereto, for example. If the logic (the potential) of the data holding terminal 3a is the same as the logic (the potential) of the data holding terminal 4a, the output of the exclusive-OR circuit 11a is at "Low" level. If the logic (the potential) of the data holding terminal 3a is different from the logic (the potential) of the data holding terminal 4a, the output of the exclusive-OR circuit 11a is at "High" level. The "High"-level signal serves as an error detection signal Se.

In this manner, the error detection circuit 11 senses the logic of the data holding terminal 3a and the logic of the data holding terminal 4a, and outputs the error detection signal Se if the two logics differ from each other.

An example of the operation to be performed by the semiconductor integrated circuit 100 to improve the soft-error resistance with the above structure is now described.

First, the control circuit 8 uses the control signal S3 to cause the clock signal generating circuit 5 to control the first clock signal mclk and the second clock signal sclk. As a result, the data that is held by the master latch circuit 3 and is input from the master latch circuit 3 is put into a state A where the data is held by the slave latch circuit 4, or the data that is held by the master latch circuit 3 and is input from the master latch circuit 3 is put into a state B where the data passes through the slave latch circuit 4 and reaches the data output terminal 2.

In this manner, the control circuit 8 makes the logic of the data held by the data holding terminal 3a and the logic of the data held by the data holding terminal 4a equal to each other. Also, the control circuit 8 makes the logic of the data held by the data holding terminal 3b and the logic of the data held by the data holding terminal 4b equal to each other.

In either the state A or the state B, the control circuit 8 uses the control signals S1 and S2 to switch on the first switch circuit 6 and the second switch circuit 7. The control circuit 8 further puts the flip-flop into the state A, if the flip-flop is in the state B (if the flip-flop is already in the state A, the control circuit 8 leaves the flip-flop in the state A).

While the first switch circuit 6 is in the ON state, the error detection circuit 11 senses the logic of the data holding terminal 3a and the logic of the data holding terminal 4a.

Here, the first switch circuit 6 has a limited resistance value, as already mentioned. Accordingly, even if the data holding terminals of the master latch circuit 3 and the slave latch circuit 4 are electrically connected to each other, the data held by the master latch circuit 3 (or the slave latch circuit 4) can be inverted by an alpha ray or a neutron ray, for example. In this manner, the logic held by the data holding terminal of the master latch circuit 3 can differ from the logic held by the data holding terminal of the slave latch circuit.

If the logic of the data holding terminal 3a and the logic of the data holding terminal 4a differ from each other, the error detection circuit 11 outputs the error detection signal Se. As already mentioned, based on the error detection signal Se, the data held by the flip-flop 10 is replaced with correct data, so as to improve the soft-error resistance.

Through the above operation of the semiconductor integrated circuit 100, the soft-error resistance can be improved.

Figure 3:
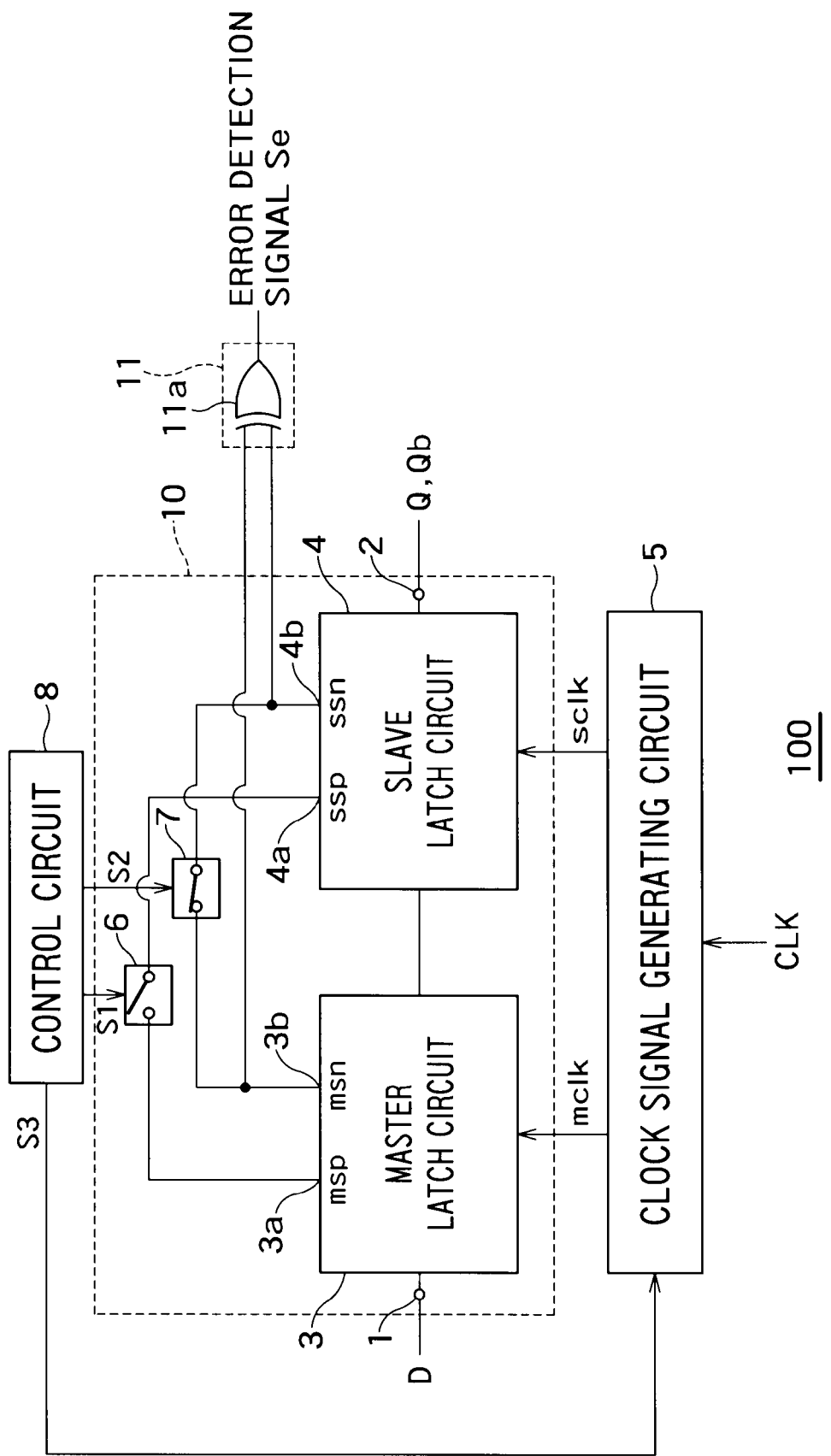
FIG. 3 is a diagram showing another structure of the main section of a semiconductor integrated circuit 100 in accordance with a first embodiment of the present invention.

FIG. 3 is a diagram showing another structure of the main section of a semiconductor integrated circuit 100 in accordance with a first embodiment of the present invention.

As shown in FIG. 3, the error detection circuit 11 may also be formed with an exclusive-OR circuit 11a that has the logic (the potential) of the data holding terminal 3b and the logic (the potential) of the data holding terminal 4b input thereto, for example.

If the logic (the potential) of the data holding terminal 3b is the same as the logic (the potential) of the data holding terminal 4b, the output of the exclusive-OR circuit 11a is at "Low" level. If the logic (the potential) of the data holding terminal 3b is different from the logic (the potential) of the data holding terminal 4b, the output of the exclusive-OR circuit 11a is at "High" level. The "High"-level signal serves as an error detection signal Se.

In this manner, the error detection circuit 11 senses the logic of the data holding terminal 3b and the logic of the data holding terminal 4b, and outputs the error detection signal Se if the two logics differ from each other.

The operation and functions of the semiconductor integrated circuit 100 illustrated in FIG. 3 are the same as those of the semiconductor integrated circuit 100 illustrated in FIG. 2.

The clock signal generating circuit 5 and the control circuit 8 may be shared between two or more flip-flops 10.

In the semiconductor integrated circuit 100, at least one of the first switch circuit 6 and the second switch circuit 7 should be provided. If only one of the switch circuits is provided, the error detection circuit 11 should be capable of sensing the logic of the data holding terminal of the master latch circuit 3 and the logic of the data holding terminal of the slave latch circuit 4 connected to the single switch circuit.

As described above, in the semiconductor integrated circuit of this embodiment, the soft-error resistance of the flip-flop can be improved.

Second Embodiment

A second embodiment concerns an example structure in which the error detection circuit senses the currents flowing in switch circuits, so as to indirectly sense the logic of the data holding terminal of the master latch circuit and the logic of the data holding terminal of the slave latch circuit.

Figure 4:
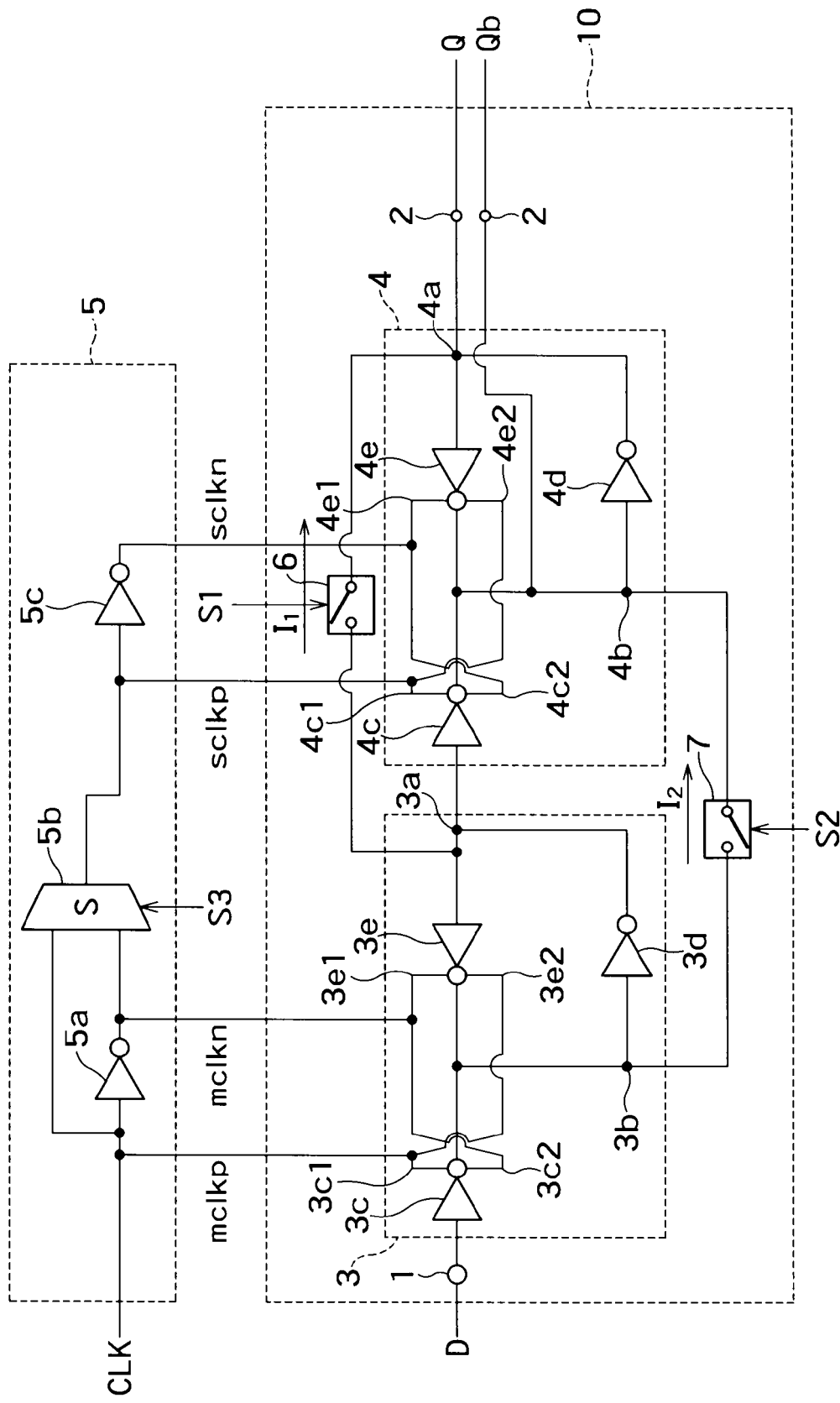
FIG. 4 is a diagram showing specific example circuit structures of the flip-flop, and the clock signal generating circuit of the first embodiment shown in FIGS. 2 and 3.

FIG. 4 is a diagram showing specific example circuit structures of the flip-flop, and the clock signal generating circuit of the first embodiment shown in FIGS. 2 and 3.

As shown in FIG. 4, the master latch circuit 3 includes the data holding terminal 3a, the data holding terminal 3b, a first clocked inverter 3c, a first inverter 3d, and a second clocked inverter 3e.

In the following, the first clock signal mclk shown in FIGS. 2 and 3 is explained as a positive-phase clock signal (hereinafter referred to as the first (positive-phase) clock signal) mclkp and a negative-phase clock signal mclkn.

The first clocked inverter 3c has its input connected to the data input terminal 1, and has its output connected to the data holding terminal 3b. The first clocked inverter 3c has a first clock terminal 3c1 that has the first clock signal mclkp input thereto, and a second clock terminal 3c2 that has the clock signal mclkn in the opposite phase of the first clock signal mclkp input thereto.

The first inverter 3d has its input connected to the data holding terminal 3b, and has its output connected to the data holding terminal 3a.

The second clocked inverter 3e has its input connected to the data holding terminal 3a, and has its output connected to the data holding terminal 3b. The second clocked inverter 3e has a third clock terminal 3e1 that has the clock signal mclkn in the opposite phase of the first clock signal mclkp input thereto, and a fourth clock terminal 3e2 that has the first clock signal mclkp input thereto.

The slave latch circuit 4 includes the data holding terminal 4a, the data holding terminal 4b, a third clocked inverter 4c, a second inverter 4d, and a fourth clocked inverter 4e.

In the following, the second clock signal sclk shown in FIGS. 2 and 3 is explained as a positive-phase clock signal (hereinafter referred to as the second (positive-phase) clock signal) sclkp and a negative-phase clock signal sclkn.

The third clocked inverter 4c has its input connected to the data holding terminal 3a of the master latch circuit 3, and has its output connected to the data holding terminal 4b. The third clocked inverter 4c has a fifth clock terminal 4c1 that has the second clock signal sclkp input thereto, and a sixth clock terminal 4c2 that has the clock signal sclkn in the opposite phase of the second clock signal sclkp input thereto.

The second inverter 4d has its input connected to the data holding terminal 4b, and has its output connected to the data holding terminal 4a.

The fourth clocked inverter 4e has its input connected to the data holding terminal 4a, and has its output connected to the data holding terminal 4b. The fourth clocked inverter 4e has a seventh clock terminal 4e1 that has the clock signal sclkn in the opposite phase of the second clock signal sclkp input thereto, and an eighth clock terminal 4e2 that has the second clock signal sclkp input thereto.

When outputting an output Q, the data output terminal 2 is connected to the data holding terminal 4a. When outputting an output Qb, the data output terminal is connected to the data holding terminal 4b.

The clock signal generating circuit 5 includes an inverter 5a, a selector 5b, and an inverter 5c.

The inverter 5a has its input connected to the first clock terminal 3c1 and the fourth clock terminal 3e2, and has its output connected to the second clock terminal 3c2 and the third clock terminal 3e1. The reference clock signal CLK (herein used as the positive-phase clock signal mclkp) is input to the inverter 5a, and the inverter 5a outputs the signal (the negative-phase clock signal mclkn) obtained by inverting the reference clock signal CLK.

The selector 5b has the reference clock signal CLK (which is the positive-phase clock signal mclkp) and the negative-phase clock signal mclkn input thereto. In response to the control signal S3, the selector 5b outputs either the positive-phase clock signal mclkp or the negative-phase clock signal mclkn as the second clock signal sclkp to the fifth clock terminal 4c1 and the eighth clock terminal 4e2.

In a regular operation, the selector 5b outputs the negative-phase clock signal mclkn in response to the control signal S3. To improve the soft-error resistance, the selector 5b outputs the positive-phase clock signal mclkp in response to the control signal S3.

The inverter 5c has its input connected to the fifth clock terminal 4c1 and the eighth clock terminal 4e2, and has its output connected to the sixth clock terminal 4c2 and the seventh clock terminal 4e1. The positive-phase clock signal sclkp is input to the inverter 5c, and the inverter 5c outputs the signal (the negative-phase clock signal sclkn) generated by inverting the positive-phase clock signal sclkp.

As described above, the clock signal generating circuit 5 generates the various clock signals mclkp, mclkn, sclkp, and sclkn, in response to the reference clock signal CLK.

In response to the clock signal mclkp or mclkn, the master latch circuit 3 holds the data that is input from the data input terminal 1, or outputs the input data as it is (or outputs the input data after buffering).

In response to the clock signal sclkp or sclkn, the slave latch circuit 4 holds the data that is input from the master latch circuit 3, or outputs the input data as it is (or outputs the input data after buffering).

An example of the operation to be performed by the semiconductor integrated circuit 100 to improve the soft-error resistance with the above structure is now described.

First, the control circuit 8 uses the control signal S3 to cause the clock signal generating circuit 5 to control the first clock signal mclk (mclkp, mclkn) and the second clock signal sclk (sclkp, sclkn). For example, the control circuit 8 uses the control signal S3 to cause the clock signal generating circuit 5 to switch the clock signals mclkp and sclkp to "High" level (the logic "1") (or switch the clock signals mclkn and sclkn to "Low" level (the logic "0")).

As a result, the data that is held by the master latch circuit 3 and is input from the master latch circuit 3 is put into a state A where the data is held by the slave latch circuit 4, or the data that is held by the master latch circuit 3 and is input from the master latch circuit 3 is put into a state B where the data passes through the slave latch circuit 4 and reaches the data output terminal 2.

In this manner, the control circuit 8 makes the logic of the data held by the data holding terminal 3a and the logic of the data held by the data holding terminal 4a equal to each other. Also, the control circuit 8 makes the logic of the data held by the data holding terminal 3b and the logic of the data held by the data holding terminal 4b equal to each other.

In either the state A or the state B, the control circuit 8 uses the control signals S1 and S2 to switch on the first switch circuit 6 and the second switch circuit 7. The control circuit 8 further puts the flip-flop into the state A, if the flip-flop is in the state B (if the flip-flop is already in the state A, the control circuit 8 leaves the flip-flop in the state A).

Here, the first switch circuit 6 and the second switch circuit 7 each have a limited resistance value, as already mentioned. Accordingly, even if the data holding terminals of the master latch circuit 3 and the slave latch circuit 4 are electrically connected to each other, the data held by the master latch circuit 3 (or the slave latch circuit 4) can be inverted by an alpha ray or a neutron ray, for example.

In this manner, the logic held by the data holding terminal of the master latch circuit 3 can differ from the logic held by the data holding terminal of the slave latch circuit. In this case, a certain potential difference is caused between the data holding terminal of the master latch circuit 3 and the data holding terminal of the slave latch circuit.

If those two logics are the same and almost no potential difference exists, current hardly flows in the first and second switch circuits 6 and 7. If the two logics differ from each other, however, a current I1 equal to or greater than a certain value flows in the first switch circuit 6, and a current I2 equal to or greater than a certain value flows in the second switch circuit 7.

Therefore, in the second embodiment, the error detection circuit senses the current flowing in the switch circuits, so as to indirectly sense the logic of the data holding terminal of the master latch circuit and the logic of the data holding terminal of the slave latch circuit.

Figure 5:
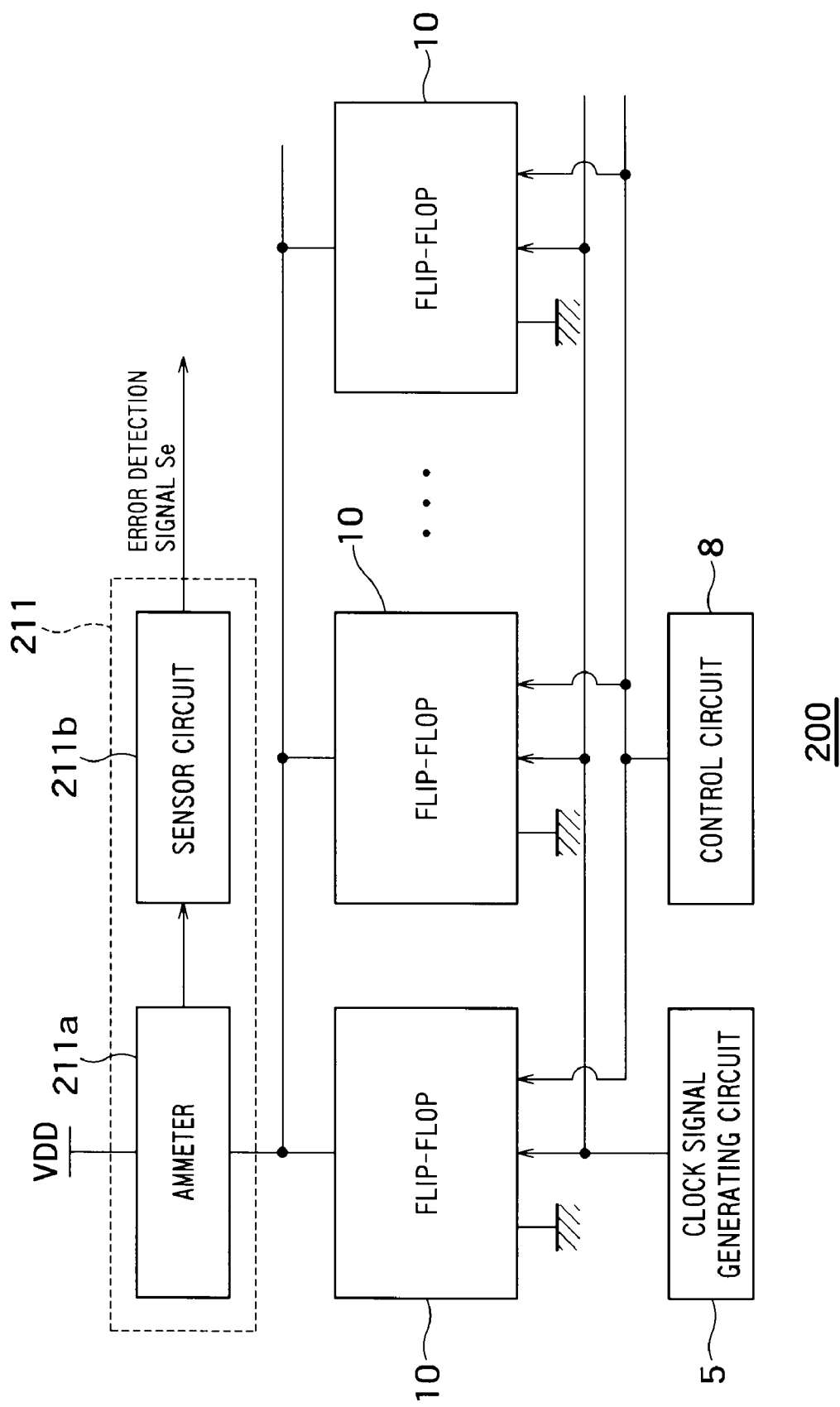
FIG. 5 is a diagram showing the structure of a main section of a semiconductor integrated circuit 200 in accordance with a second embodiment of the present invention.

FIG. 5 is a diagram showing the structure of a main section of a semiconductor integrated circuit 200 in accordance with the second embodiment of the present invention.

As shown in FIG. 5, a semiconductor integrated circuit 200 includes a clock signal generating circuit 5, a control circuit 8, flip-flops 10, and an error detection circuit 211. The structures and operations of the clock signal generating circuit 5, the control circuit 8, and the flip-flops 10 are the same as those of the first embodiment.

The error detection circuit 211 monitors the current flowing in the first switch circuit 6 or the second switch circuit 7 of each flip-flop 10. If the current is equal to or greater than a first predetermined value, the error detection circuit 211 outputs an error detection signal. Alternatively, the error detection circuit 211 may monitor the total amount of the current supplied to the master latch circuit and the slave latch circuit, and, if the total amount of the current is equal to or greater than a predetermined value, the error detection circuit 211 may output the error detection signal Se.

The error detection circuit 211 includes an ammeter 211a that measures the current consumed in the flip-flops 10, and a sensor circuit 211b that senses an error based on the measured current value and outputs the error detection signal Se. With this structure, the error detection circuit 211 monitors the current flowing in the first switch circuit 6 or the second switch circuit 7.

If the logic held by the data holding terminal of the master latch circuit 3 differs from the logic held by the data holding terminal of the slave latch circuit 4, a current flows in a switch circuit in an ON state, as described above. In other words, if the two logics differ from each other, the amount of the current consumed in the flip-flops 10 increases.

Accordingly, by monitoring the current consumption in each flip-flop 10, the error detection circuit 211 can indirectly monitor the current flowing in the first switch circuit 6 or the second switch circuit 7 of each flip-flop 10. If the current consumption is equal to or greater than a second predetermined value, the error detection circuit 211 can determine that the amount of the current flowing in the first switch circuit 6 or the second switch circuit 7 is equal to or greater than the first predetermined value. In such a case, the error detection circuit 211 can determine that the two logics differ from each other (or there is an error).

With the current consumption in all the flip-flops 10 being taken into consideration, the total current consumption increases if the two logics differ from each other in one of the flip-flops 10.

Therefore, by monitoring the total current consumption of all the flip-flops 10, the error detection circuit 211 can determine that the amount of the current flowing in the first switch circuit 6 or the second switch circuit 7 of one of the flip-flops 10 is equal to or greater than the first predetermined value, if the total current consumption is equal to or greater than a third predetermined value. In such a case, the error detection circuit 211 can determine that there is a flip-flop 10 having different logics (or there is an error) as described above.

In this manner, the error detection circuit 211 outputs an error detection signal, if the amount of the current flowing in the first switch circuit 6 or the second switch circuit 7 of the flip-flop 10 is equal to or greater than the first predetermined value.

An example of the operation to be performed by the semiconductor integrated circuit 200 to improve the soft-error resistance with the above structure is now described.

First, the control circuit 8 uses the control signal S3 to cause the clock signal generating circuit 5 to control the first clock signal mclk and the second clock signal sclk, as in the first embodiment. As a result, the data that is held by the master latch circuit 3 and is input from the master latch circuit 3 is put into a state A where the data is held by the slave latch circuit 4, or the data that is held by the master latch circuit 3 and is input from the master latch circuit 3 is put into a state B where the data passes through the slave latch circuit 4 and reaches the data output terminal 2.

In this manner, the control circuit 8 makes the logic of the data held by the data holding terminal 3a and the logic of the data held by the data holding terminal 4a equal to each other. Also, the control circuit 8 makes the logic of the data held by the data holding terminal 3b and the logic of the data held by the data holding terminal 4b equal to each other.

In either the state A or the state B, the control circuit 8 uses the control signals S1 and S2 to switch on the first switch circuit 6 and the second switch circuit 7 of the flip-flop 10. The control circuit 8 further puts the flip-flop into the state A, if the flip-flop is in the state B (if the flip-flop is already in the state A, the control circuit 8 leaves the flip-flop in the state A).

While the first switch circuit 6 is in the ON state, the error detection circuit 211 monitors the current flowing in the first switch circuit 6 or the second switch circuit 7 of the flip-flop 10. If the current is equal to or greater than the first predetermined value, the error detection circuit 211 outputs the error detection signal Se.

Based on the error detection signal Se, the data stored in each flip-flop is rewritten, so as to improve the soft-error resistance, as already mentioned.

In a case where the error detection circuit 211 monitors the total amount of the current supplied to the master latch circuit and the slave latch circuit, the error detection circuit 211 may output the error detection signal Se, if the total amount of the current is equal to or greater than a predetermined value, while the first switch circuit 6 and the second switch circuit 7 are in the ON state, after the first switch circuit 6 and the second switch circuit 7 of each flip-flop 10 are switched on in the above described manner.

As described above, in the semiconductor integrated circuit of this embodiment, the soft-error resistance of each flip-flop can be improved.

Third Embodiment

As a third embodiment of the present invention, a more specific example of the error detection circuit of the second embodiment is described.

Figure 6:
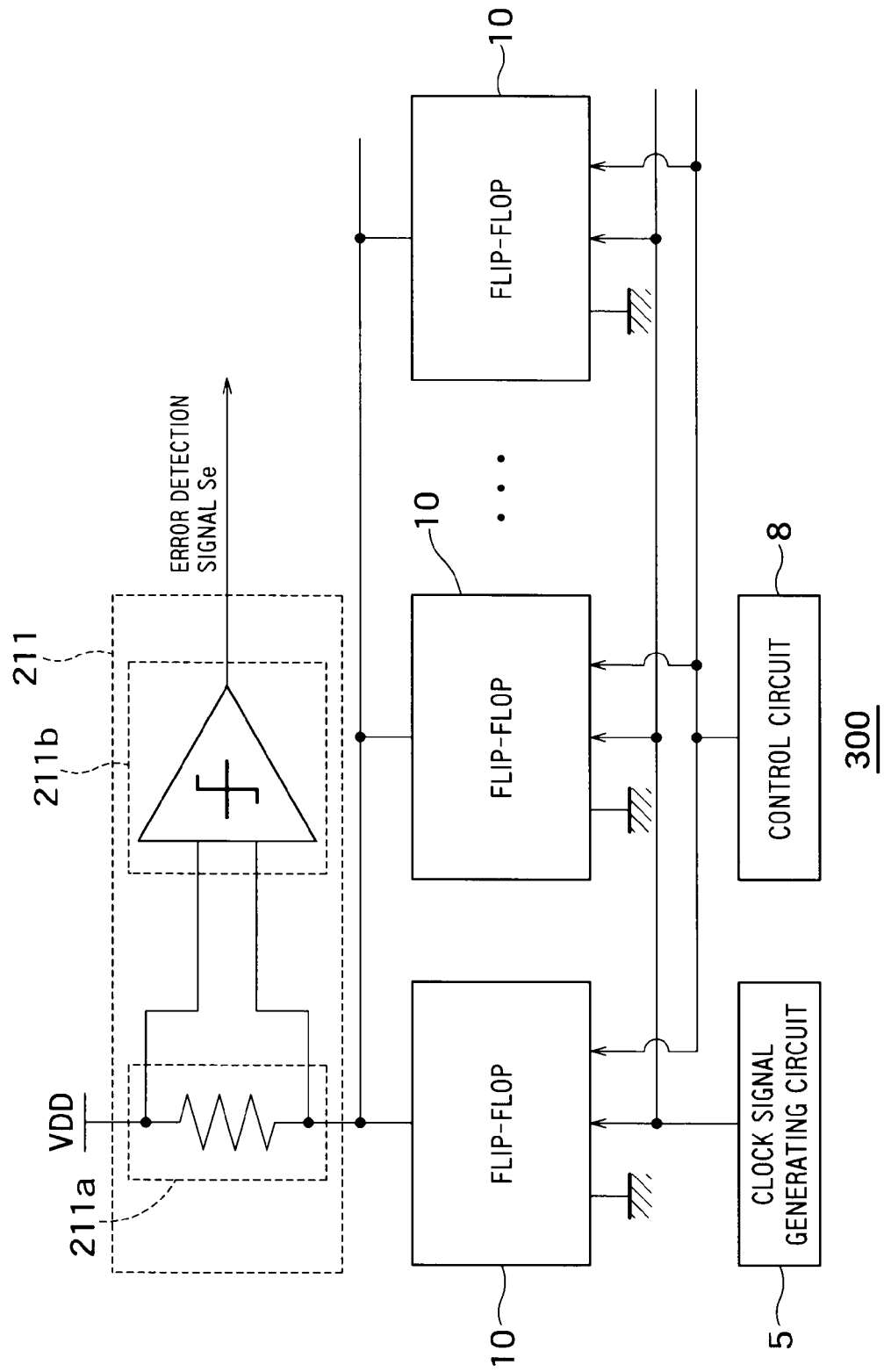
FIG. 6 is a diagram showing the structure of a main section of a semiconductor integrated circuit 300 in accordance with a third embodiment of the present invention.

FIG. 6 is a diagram showing the structure of a main section of a semiconductor integrated circuit 300 in accordance with a third embodiment of the present invention. The structures of the clock signal generating circuit 5, the control circuit 8, and the flip-flops 10 shown in FIG. 6 are the same as those of the first embodiment.

As shown in FIG. 6, the ammeter 211a of the error detection circuit 211 is formed with a resistor. Also, the sensor circuit 211b of the error detection circuit 211 has the potentials of both ends of the resistor input thereto, and is formed with a comparator having certain input offset voltage that outputs the error detection signal Se based on the difference between the potentials. Since the resistance value of the resistor is a known value, the comparator outputs the error detection signal Se, when the difference between the potentials of both ends of the resistor is larger than a predetermined value (or when the current consumption of the flip-flops 10 is greater than a predetermined value).

The semiconductor integrated circuit 300 having the above structure can improve the soft-error resistance of the flip-flops, like the semiconductor integrated circuit 200 of the second embodiment.

Fourth Embodiment

As a fourth embodiment of the present invention, a specific example of the structure for improving the soft-error resistance with the use of the error detection signal is described. Although only one flip-flop is used in the following example case, this embodiment may be applied to a case where more than one flip-flop is used as in the second embodiment.

Figure 7:
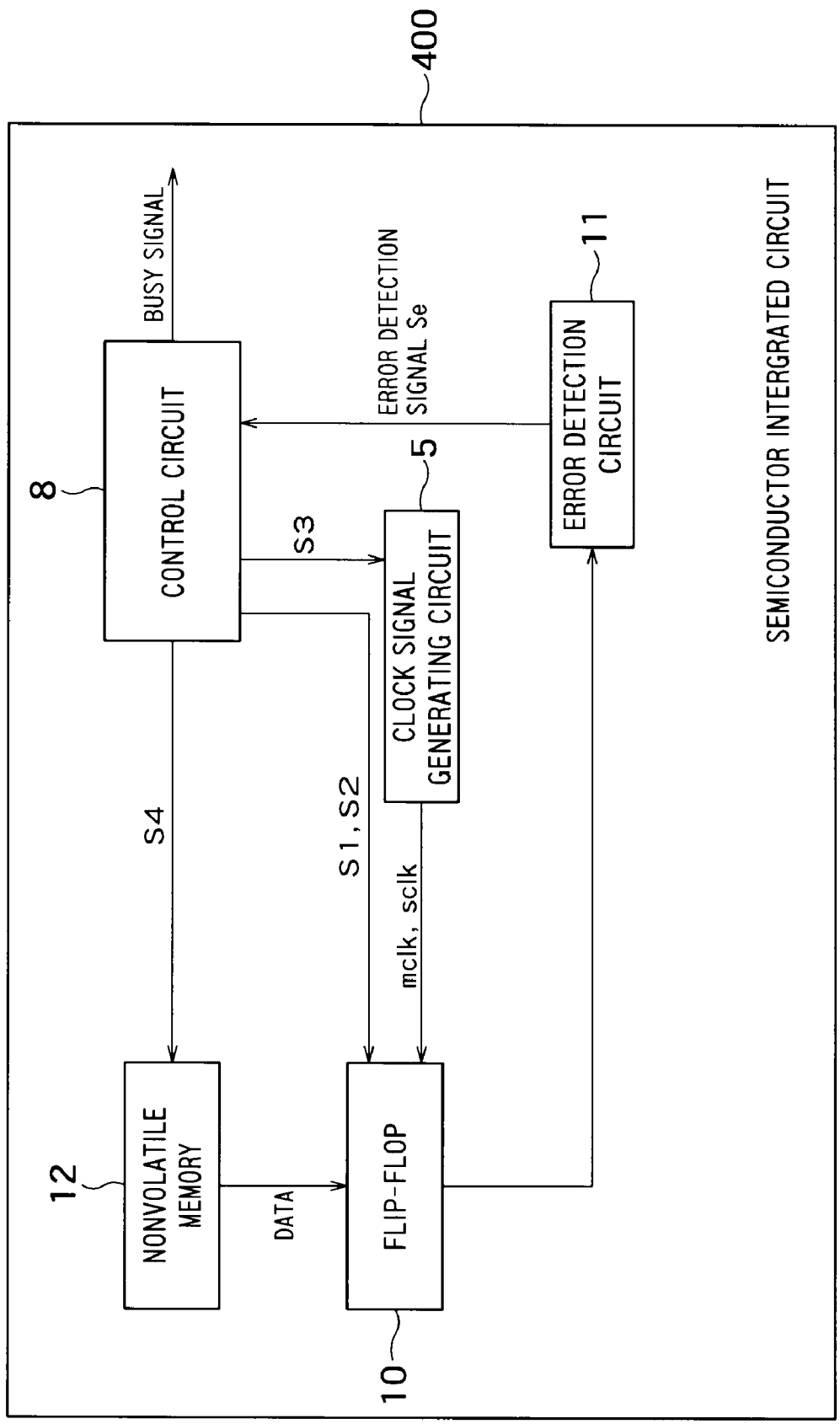
FIG. 7 is a diagram showing the structure of a main section of a semiconductor integrated circuit 400 in accordance with a fourth embodiment of the present invention.

FIG. 7 is a diagram showing the structure of a main section of a semiconductor integrated circuit 400 in accordance with the fourth embodiment of the present invention.

As shown in FIG. 7, a semiconductor integrated circuit 400 includes a clock signal generating circuit 5, a control circuit 8, a flip-flop 10, an error detection circuit 11, and a nonvolatile memory 12. The structures and operations of the clock signal generating circuit 5, the control circuit 8, the flip-flop 10, and the error detection circuit 11 are the same as those of the first embodiment.

The nonvolatile memory 12 stores data that is to be stored into the flip-flop 10. The nonvolatile memory 12 is formed with a ROM (Read Only Memory), for example.

An example of the operation to be performed by the semiconductor integrated circuit 400 to improve the soft-error resistance with the above structure is now described.

First, the control circuit 8 uses the control signal S3 to cause the clock signal generating circuit 5 to control the first clock signal mclk and the second clock signal sclk, as in the first embodiment. As a result, the data that is held by the master latch circuit 3 and is input from the master latch circuit 3 is put into a state A where the data is held by the slave latch circuit 4, or the data that is held by the master latch circuit 3 and is input from the master latch circuit 3 is put into a state B where the data passes through the slave latch circuit 4 and reaches the data output terminal 2.

In this manner, the control circuit 8 makes the logic of the data held by the data holding terminal 3a and the logic of the data held by the data holding terminal 4a equal to each other. Also, the control circuit 8 makes the logic of the data held by the data holding terminal 3b and the logic of the data held by the data holding terminal 4b equal to each other.

In either the state A or the state B, the control circuit 8 uses the control signals S1 and S2 to switch on the first switch circuit 6 and the second switch circuit 7.

While the first switch circuit 6 is in the ON state, the error detection circuit 11 senses the logic of the data holding terminal 3a and the logic of the data holding terminal 4a.

If the logic of the data holding terminal 3a and the logic of the data holding terminal 4a differ from each other, the error detection circuit 11 outputs the error detection signal Se.

In response to the error detection signal Se, the control circuit 8 outputs a control signal S4 to the nonvolatile memory 12, so that the data stored in the nonvolatile memory 12 is written into the flip-flop 10. In other words, in response to the error detection signal Se, the control circuit 8 causes the master latch circuit 3 to hold the logic of the data stored in the nonvolatile memory 12.

In this manner, the data held by the flip-flop 10 can be replaced with correct data, and the soft-error resistance can be improved.

The control circuit 8 outputs a busy signal at least during the time between the reception of the error detection signal Se and the storing of the logic of the data from the nonvolatile memory 12 into the master latch circuit 3. The external circuit (not shown) that receives the busy signal stops accessing the information based on the data held by the flip-flop 10 (or the master latch circuit 3), for example. Thus, the external circuit can be prevented from accessing the information based on the data determined to have an error, and a wrong circuit operation can be avoided.

Through the above operation of the semiconductor integrated circuit 400, the soft-error resistance can be improved.

In this embodiment, the semiconductor integrated circuit 400 has the error detection circuit 11 of the first embodiment, but may have the error detection circuit 211 of the second embodiment instead.

The flip-flop 10 and the error detection circuit 11 may be provided in a DRAM in the semiconductor integrated circuit 400. Alternatively, the flip-flop 10, the error detection circuit 11, and the nonvolatile memory 12 may be provided in the DRAM in the semiconductor integrated circuit 400.

What is claimed is:

1. A semiconductor integrated circuit comprising:
a data input terminal;
a data output terminal;

a master latch circuit that has an input connected to the data input terminal, and has a first data holding terminal that holds a first logic of data that is input through the data input terminal or a second logic generated by inverting the first logic of the data;

a slave latch circuit that has an input connected to an output of the master latch circuit, has an output connected to the data output terminal, and has a second data holding terminal that holds a logic being equal to a logic held by the first data holding terminal in accordance with data that is input from the master latch circuit;

a clock signal generating circuit that generates and outputs a first clock signal for controlling an operation of the master latch circuit, and generates and outputs a second clock signal for controlling an operation of the slave latch circuit;

a switch circuit that is connected between the first data holding terminal and the second data holding terminal;

an error detection circuit that senses a logic of the first data holding terminal and a logic of the second data holding terminal, and outputs an error detection signal when a logic of the first data holding terminal and a logic of the second data holding terminal differ from each other; and a control circuit that controls the clock signal generating circuit and the switch circuit, wherein the control circuit causes the clock signal generating circuit to control the first clock signal and the second clock signal to make a logic of data held by the first data holding terminal and a logic of data held by the second data holding terminal equal to each other, and switches on the switch circuit, and the error detection circuit senses a logic of the first data holding terminal and a logic of the second data holding terminal after switching on the switching circuit.

2. The semiconductor integrated circuit according to claim 1, further comprising a nonvolatile memory that stores data, wherein, in response to the error detection signal, the control circuit causes the master latch circuit to hold a logic of the data stored in the nonvolatile memory.

3. The semiconductor integrated circuit according to claim 2, wherein the control circuit outputs a busy signal at least during a time between receiving of the error detection signal and storing of the logic of the data from the nonvolatile memory into the master latch circuit.

4. The semiconductor integrated circuit according to claim 3, wherein, in response to the busy signal, an access from outside to information based on the data stored in the master latch circuit is stopped.

5. A semiconductor integrated circuit comprising:

a data input terminal;

a data output terminal;

a master latch circuit that has an input connected to the data input terminal, and has a first data holding terminal that holds a first logic of data that is input through the data input terminal or a second logic generated by inverting the first logic of the data;

a slave latch circuit that has an input connected to an output of the master latch circuit, has an output connected to the data output terminal, and has a second data holding terminal that holds a logic being equal to a logic held by the first data holding terminal in accordance with data that is input from the master latch circuit;

a clock signal generating circuit that generates and outputs a first clock signal for controlling an operation of the master latch circuit, and generates and outputs a second clock signal for controlling an operation of the slave latch circuit;

a switch circuit that is connected between the first data holding terminal and the second data holding terminal;

an error detection circuit that monitors current flowing in the switch circuit, and outputs an error detection signal when the current is equal to or greater than a predetermined value; and a control circuit that controls the clock signal generating circuit and the switch circuit, wherein the control circuit causes the clock signal generating circuit to control the first clock signal and the second clock signal to make a logic of data held by the first data holding terminal and a logic of data held by the second data holding terminal equal to each other, and switches on the switch circuit, and the error detection circuit monitors current flowing in the switch circuit when the switch circuit is in ON state after switching on the switching circuit.

6. The semiconductor integrated circuit according to claim 5, further comprising a nonvolatile memory that stores data, wherein, in response to the error detection signal, the control circuit causes the master latch circuit to hold a logic of the data stored in the nonvolatile memory.

7. The semiconductor integrated circuit according to claim 6, wherein the control circuit outputs a busy signal at least during a time between receiving of the error detection signal and storing of the logic of the data from the nonvolatile memory into the master latch circuit.

8. The semiconductor integrated circuit according to claim 7, wherein, in response to the busy signal, an access from outside to information based on the data stored in the master latch circuit is stopped.

9. A semiconductor integrated circuit comprising:

a data input terminal;

a data output terminal;

a master latch circuit that has an input connected to the data input terminal, and has a first data holding terminal that holds a first logic of data that is input through the data input terminal or a second logic generated by inverting the first logic of the data;

a slave latch circuit that has an input connected to an output of the master latch circuit, has an output connected to the data output terminal, and has a second data holding terminal that holds a logic being equal to a logic held by the first data holding terminal in accordance with data that is input from the master latch circuit;

a clock signal generating circuit that generates and outputs a first clock signal for controlling an operation of the master latch circuit, and generates and outputs a second clock signal for controlling an operation of the slave latch circuit;

a switch circuit that is connected between the first data holding terminal and the second data holding terminal;

an error detection circuit that monitor current supplied to the master latch circuit and the slave latch circuit, and outputs an error detection signal when the current is equal to or greater than a predetermined value; and a control circuit that controls the clock signal generating circuit and the switch circuit, wherein the control circuit causes the clock signal generating circuit to control the first clock signal and the second clock signal to make a logic of data held by the first data holding terminal and a logic of data held by the second data holding terminal equal to each other, and switches on the switch circuit, and the error detection circuit monitors current supplied to the master latch circuit and the slave latch circuit when the switch circuit is in ON state after switching on the switching circuit.

10. The semiconductor integrated circuit according to claim 9, further comprising a nonvolatile memory that stores data, wherein, in response to the error detection signal, the control circuit causes the master latch circuit to hold a logic of the data stored in the nonvolatile memory.

11. The semiconductor integrated circuit according to claim 10, wherein the control circuit outputs a busy signal at least during a time between receiving of the error detection signal and storing of the logic of the data from the nonvolatile memory into the master latch circuit.

12. The semiconductor integrated circuit according to claim 11, wherein, in response to the busy signal, an access from outside to information based on the data stored in the master latch circuit is stopped.

* * * * *